United States Patent
Jennings

(10) Patent No.: US 7,005,601 B2
(45) Date of Patent: Feb. 28, 2006

(54) THERMAL FLUX PROCESSING BY SCANNING

(75) Inventor: Dean Jennings, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/126,419

(22) Filed: Apr. 18, 2002

(65) Prior Publication Data

US 2003/0196995 A1 Oct. 23, 2003

(51) Int. Cl.
*B23K 26/00* (2006.01)

(52) U.S. Cl. .......................... 219/121.66; 219/121.65; 438/487

(58) Field of Classification Search ............ 219/121.65, 219/121.66; 438/487
See application file for complete search history.

(56) References Cited

U.S. PATENT DOCUMENTS

| | | | |
|---|---|---|---|
| 3,720,784 A | 3/1973 | Maydan et al. | |
| RE28,375 E | 3/1975 | Maydan et al. | |
| 4,151,008 A | 4/1979 | Kirkpatrick | 148/1.5 |
| 4,469,551 A * | 9/1984 | Laude | 438/479 |
| 4,520,472 A | 5/1985 | Reno | |
| 4,868,005 A | 9/1989 | Ehrlich et al. | 427/53.1 |
| 5,269,847 A | 12/1993 | Anderson et al. | |
| 5,323,269 A * | 6/1994 | Walker et al. | 359/739 |
| 5,357,365 A | 10/1994 | Ipposhi et al. | |
| 5,463,534 A | 10/1995 | Raven | 362/32 |
| 5,508,067 A | 4/1996 | Sato et al. | |
| 5,529,630 A * | 6/1996 | Imahashi et al. | |
| 5,612,251 A * | 3/1997 | Lee | 438/795 |
| 5,660,472 A | 8/1997 | Peuse et al. | |
| 5,782,980 A | 7/1998 | Allen et al. | |
| 5,986,234 A | 11/1999 | Matthews et al. | |
| 6,019,839 A | 2/2000 | Achutharaman et al. | |

(Continued)

FOREIGN PATENT DOCUMENTS

| | | |
|---|---|---|
| DE | 4234342 A1 * | 4/1994 |
| EP | 836905 A1 * | 4/1998 |
| JP | 9-40499 | 2/1997 |
| JP | 9-40500 | 2/1997 |
| JP | 2000-323428 | 11/2000 |
| WO | WO 01/73769 A1 | 10/2001 |

OTHER PUBLICATIONS

Meyerson et al., "Experimental and Chemical Kinetic Modelling Study of Silicon CVD from Monosilane and Disilane", CHEMTRONICS, 1986, vol. 1, Dec., pp. 150–155.
Vortek Impulse™ Anneal, http://www.vortek.com/semi.htm, last visited Apr. 4, 2002.

Primary Examiner—Geoffrey S. Evans
(74) Attorney, Agent, or Firm—Charles Guenzer, Esq.

(57) ABSTRACT

The thermal flux processing device includes a continuous wave electromagnetic radiation source, a stage, optics, and a translation mechanism. The continuous wave electromagnetic radiation source is preferably a diode/s. The stage is configured to receive a semiconductor substrate thereon. The optics are preferably disposed between the continuous wave electromagnetic radiation source and the stage. Also, the optics are configured to focus continuous wave electromagnetic radiation from the continuous wave electromagnetic radiation source into a line of continuous wave electromagnetic radiation on an upper surface of the semiconductor substrate. A length of the line of continuous wave electromagnetic radiation extends across an entire width of the semiconductor substrate. The translation mechanism is configured to translate the stage and the line of continuous wave electromagnetic radiation relative to one another, and preferably includes a chuck for securely grasping the substrate. A method for thermally processing a semiconductor substrate is also provided.

43 Claims, 6 Drawing Sheets

U.S. PATENT DOCUMENTS

| | | | |
|---|---|---|---|
| 6,080,965 A | 6/2000 | Osawa | |
| 6,103,014 A | 8/2000 | Lei et al. | |
| 6,204,483 B1 | 3/2001 | Fair et al. | |
| 6,215,106 B1 | 4/2001 | Boas et al. | 219/390 |
| 6,242,292 B1 | 6/2001 | Yamazaki et al. | |
| 6,323,457 B1 | 11/2001 | Jung | 219/121.83 |
| 6,326,246 B1 | 12/2001 | Yamamoto | 438/151 |
| 6,326,248 B1 | 12/2001 | Ohtani et al. | |
| 6,337,467 B1 | 1/2002 | Sik | |
| 6,365,870 B1 | 4/2002 | Petring et al. | 219/121.67 |
| 6,376,806 B1 | 4/2002 | Yoo | 219/411 |
| 6,393,042 B1 * | 5/2002 | Tanaka | |
| 6,514,339 B1 * | 2/2003 | Jung | |
| 6,531,681 B1 * | 3/2003 | Markle et al. | |
| 6,535,535 B1 * | 3/2003 | Yamazaki et al. | 372/43 |
| 6,555,423 B1 * | 4/2003 | Wada et al. | 438/166 |
| 6,567,219 B1 * | 5/2003 | Tanaka | |
| 6,809,012 B1 * | 10/2004 | Yamazaki et al. | 438/473 |
| 2004/0053450 A1 * | 3/2004 | Sposili et al. | 438/151 |

* cited by examiner

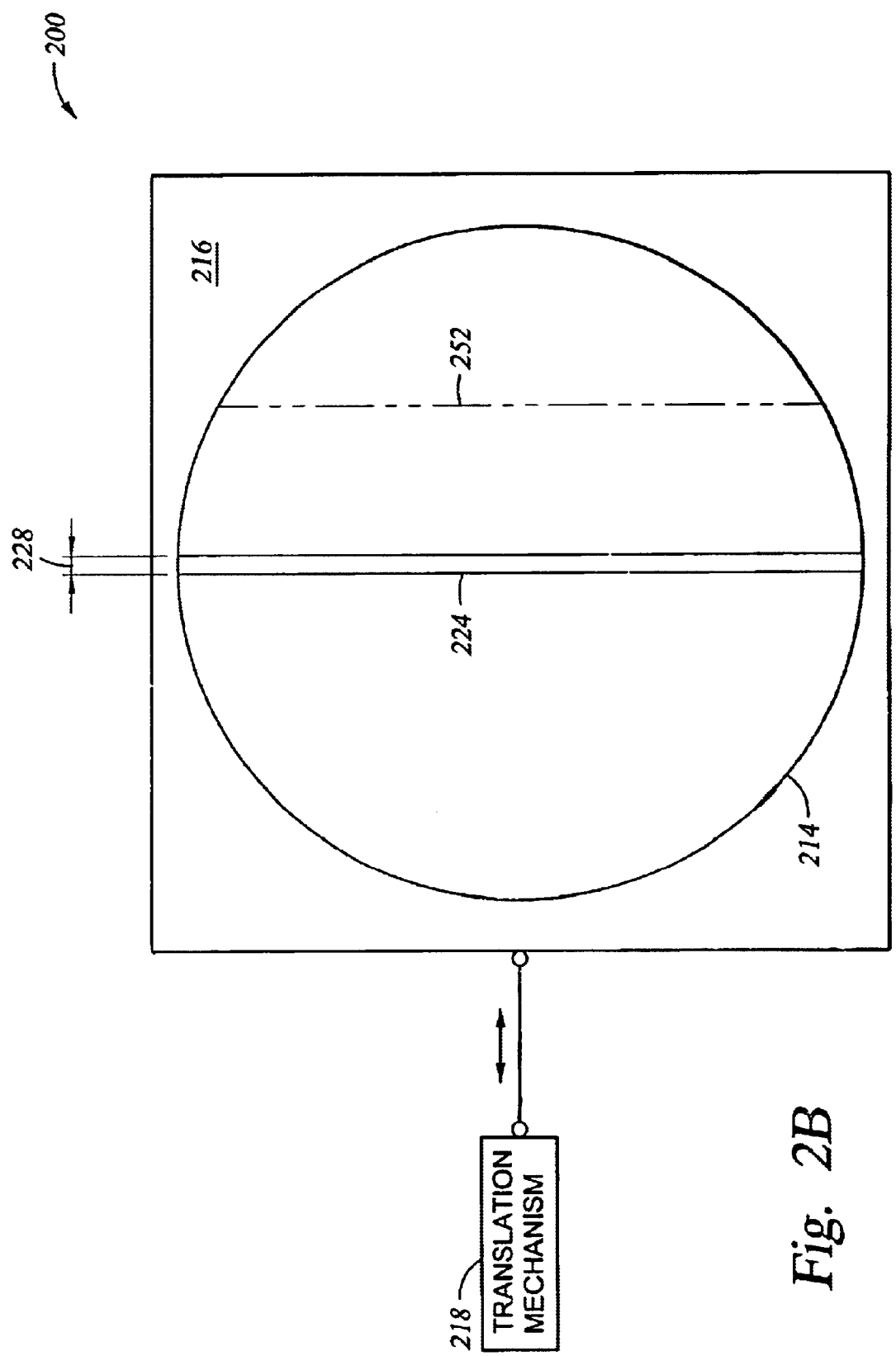

THERMAL FLUX PROCESSING BY SCANNING

BACKGROUND OF THE INVENTION

1. Field of the Invention

The invention relates generally to thermal processing. More particularly, the invention is directed to an apparatus and method for thermally processing a semiconductor substrate by scanning the substrate with a line of radiation.

2. Description of Related Art

The integrated circuit (IC) market is continually demanding greater memory capacity, faster switching speeds, and smaller feature sizes. One of the major steps the industry has taken to address these demands is to change from batch processing silicon wafers in large furnaces to single wafer processing in a small chamber.

During such single wafer processing the wafer is typically heated to high temperatures so that various chemical and physical reactions can take place in multiple IC devices defined in the wafer. Of particular interest, favorable electrical performance of the IC devices requires implanted regions to be annealed. Annealing recreates a more crystalline structure from regions of the wafer that were previously made amorphous, and activates dopants by incorporating their atoms into the crystalline lattice of the wafer. Thermal processes, such as annealing, require providing a relatively large amount of thermal energy to the wafer in a short of amount of time, and thereafter rapidly cooling the wafer to terminate the thermal process. Examples of thermal processes currently in use include Rapid Thermal Processing (RTP) and impulse (spike) annealing. While such processes are widely used, current technology is not ideal. It tends to ramp the temperature of the wafer too slowly and expose the wafer to elevated temperatures for too long. These problems become more severe with increasing wafer sizes, increasing switching speeds, and/or decreasing feature sizes.

In general, these thermal processes heat the wafers under controlled conditions according to a predetermined thermal recipe. These thermal recipes fundamentally consist of: a temperature that the semiconductor wafer must be heated to; the rate of change of temperature, i.e., the temperature ramp-up and ramp-down rates; and the time that the thermal processing system remains at a particular temperature. For example, thermal recipes may require the wafer to be heated from room temperature to distinct temperatures of 1200° C. or more, for processing times at each distinct temperature ranging up to 60 seconds, or more.

Moreover, to meet certain objectives, such as minimal diffusion, the amount of time that each semiconductor wafer is subjected to high temperatures must be restricted. To accomplish this, the temperature ramp rates, both up and down, are preferably high. In other words, it is desireable to be able to adjust the temperature of the wafer from a low to a high temperature, or visa versa, in as short a time as possible.

The requirement for high temperature ramp rates led to the development of Rapid Thermal Processing (RTP), where typical temperature ramp-up rates range from 200 to 400° C./s, as compared to 5–15° C./minute for conventional furnaces. Typical ramp-down rates are in the range of 80–150° C./s.

FIG. 1 is a graph 100 of thermal profiles of different prior art thermal processes. As can be seen, the thermal profile 102 of a typical RTP system has a 250° C./s ramp-up rate and a 90° C./s ramp-down rate.

A drawback of RTP is that it heats the entire wafer even though the IC devices reside only in the top few microns of the silicon wafer. This limits how fast one can heat up and cool down the wafer. Moreover, once the entire wafer is at an elevated temperature, heat can only dissipate into the surrounding space or structures. As a result, today's state of the art RTP systems struggle to achieve a 400° C./s ramp-up rate and a 150° C./s ramp-down rate.

FIG. 1 also shows a thermal profile 104 of a laser annealing process. Laser annealing is used during the fabrication of thin film transistor (TFT) panels. Such systems use a laser spot to melt and recrystalize polysilicon. The entire TFT panel is exposed by scanning the laser spot across successive exposure fields on the panel. For wafer applications a laser pulse is used to illuminate an exposure field for a duration of approximately 20–40 ns, where the exposure field is typically about 25 by 35 mm. As can be seen from the thermal profile 104 for laser annealing, the ramp rate is nearly instantaneous at billions of degrees per second. However, the laser pulse or flash used for laser annealing is too fast and, often does not provide enough time for sufficient annealing to occur for non-melt processes. Also, devices or structures next to the exposed regions may be exposed to extreme temperatures causing them to melt, or to temperatures that are too low resulting in too little annealing. Still further, homogenization of the thermal exposure of each portion of the wafer is difficult to attain because different regions adsorb at different rates resulting in huge temperature gradients. The process is too fast for thermal diffusion to equilibrate temperature, thereby creating severe pattern dependencies. As a result, this technology is not appropriate for single crystal silicon annealing because different regions on the wafer surface may be heated to vastly different temperatures causing large non-uniformities over short distances.

Another thermal processing system currently in development by Vortek Industries Ltd., of Canada, uses flash assisted spike annealing to attempt to provide a high thermal energy to the wafer in a short of amount of time and then rapidly cool the region to limit the thermal exposure. Use of this thermal processing system should give the junction depth of a spike anneal to 1060° C. but improve the activation with flash to 1100° C. Typically, the RTP system ramps up to the desired temperature typically around 1060° C. then begins to ramp down immediately after having reached the desired flash temperature. This is done to minimize the amount of diffusion that takes place while still getting suitable activation from the elevated temperature. The thermal profile 106 of such a flash assisted spike anneal is also shown in FIG. 1.

In view of the above, there is a need for an apparatus and method for annealing a semiconductor substrate with high ramp-up and ramp-down rates. This will offer greater control over the fabrication of smaller devices leading to increased performance. Furthermore, such an apparatus and method should ensure that every point of the wafer has a substantially homogenous thermal exposure, thereby reducing pattern dependencies and potential defects.

BRIEF SUMMARY OF THE INVENTION

According to the invention there is provided a thermal flux processing device. The thermal flux processing device includes a continuous wave electromagnetic radiation source, a stage, optics, and a translation mechanism. The continuous wave electromagnetic radiation source is preferably one or more laser diodes. The stage is configured to receive a semiconductor substrate thereon. The optics are preferably disposed between the continuous wave electromagnetic radiation source and the stage and are configured to focus continuous wave electromagnetic radiation from the continuous wave electromagnetic radiation source into a line of continuous wave electromagnetic radiation on an upper surface of the semiconductor substrate. A length of the line of continuous wave electromagnetic radiation preferably extends across an entire width of the semiconductor substrate. The translation mechanism is configured to translate the stage and the line of continuous wave electromagnetic radiation relative to one another, and preferably includes a chuck for securely grasping the substrate.

Further according to the invention there is provided a method for thermally processing a semiconductor substrate. A continuous wave of radiation is focused into a line of radiation at an upper surface of the semiconductor substrate. The line of radiation is translated relative to the surface at a constant predetermined speed. This allows for every point of the substrate to have a substantially homogenous thermal exposure or history.

Therefore, the present invention heats only a small portion of the surface of the substrate at any given moment, thereby achieving very short annealing times. This reduces the total radiated power requirement. In fact, an energy density of 150 kW/cm$^2$ is achievable on a 300 mm wafer from a 5 kW radiation source. In addition, process control is achieved by modulating scan speed rather than lamp power, thereby simplifying the control of the apparatus. This allows for highly local heating without generating defects.

By heating a small area at any given moment, it is possible to achieve millions of degrees per second ramp rates on a substrate with only a few kilowatts of radiated power. Additionally, ramp rates this high allow for the upper surface to be heated from ambient temperature to 1200° C. or higher and cooled back down to nearly ambient temperature before the bulk substrate temperature can rise. However, these ramp rates are not too high as to prevent some thermal diffusion from occurring, as limited thermal diffusion is extremely useful for homogenizing the exposure.

BRIEF DESCRIPTION OF THE DRAWINGS

For a better understanding of the nature and objects of the invention, reference should be made to the following detailed description, taken in conjunction with the accompanying drawings, in which:

FIG. 2B is a top view of the substrate and stage shown in FIG. 2A;

Figure 1:
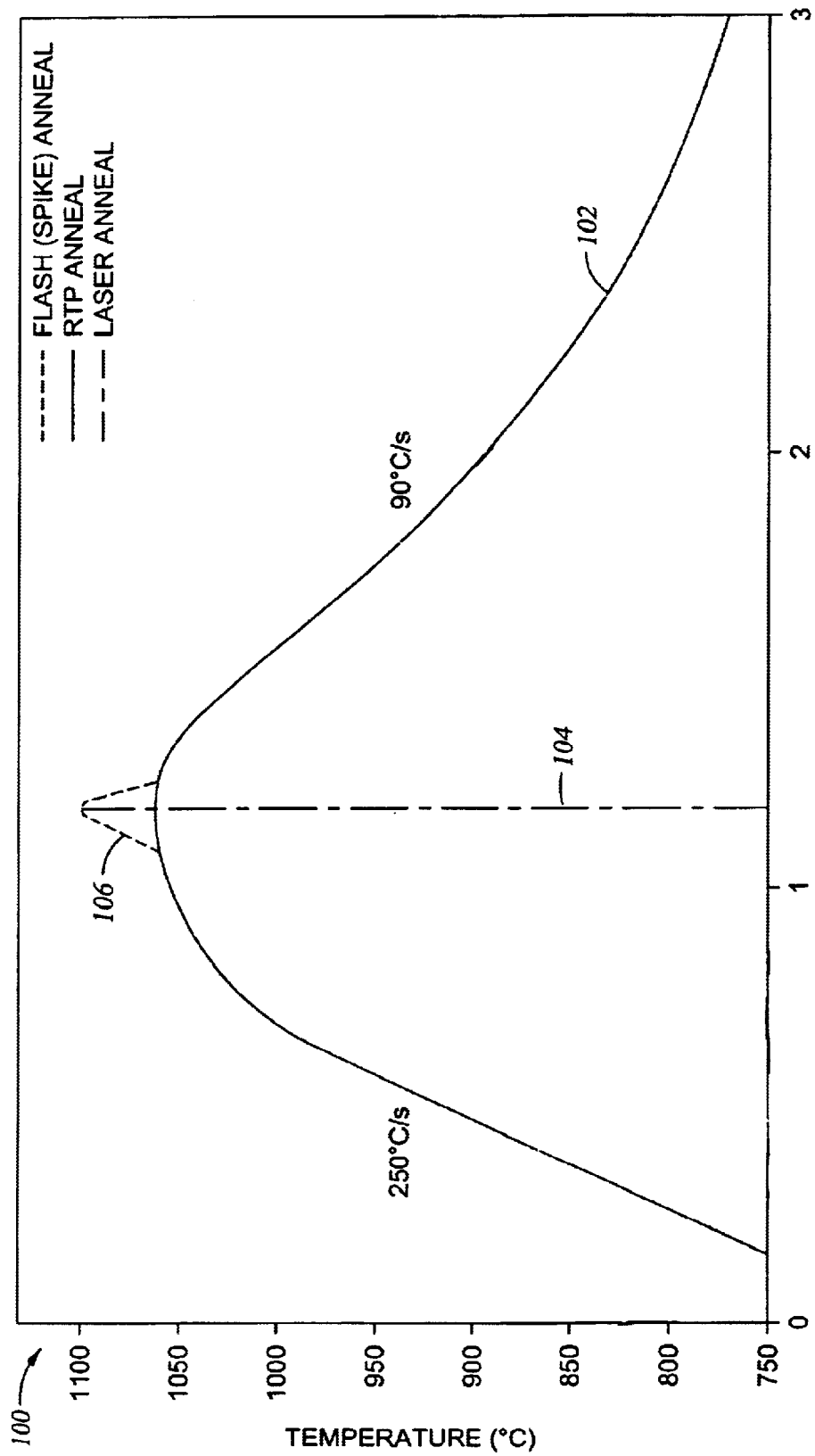
FIG. 1 is a graph of thermal profiles of different prior art thermal processes.

Like reference numerals refer to corresponding parts throughout the several views of the drawings. For ease of reference, the first number of any reference numeral generally indicates the number of the figure where the reference numeral can be found. For example, 102 can be found on FIG. 1, and 506 can be found on FIG. 5.

DETAILED DESCRIPTION OF THE INVENTION

Figure 2A:
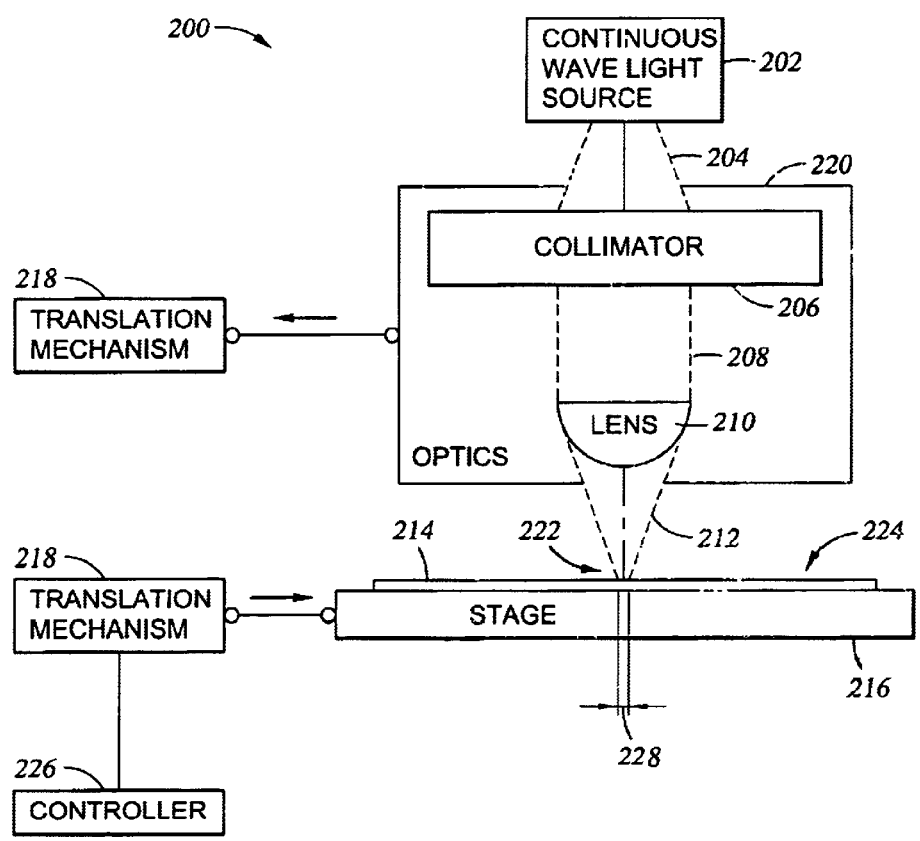
FIG. 2A is a side view of an apparatus for thermally processing a semiconductor substrate, according to an embodiment of the invention.

FIG. 2A is a side view of an apparatus 200 for thermally processing a semiconductor substrate, according to an embodiment of the invention. For the practice of the invention, the preferred thermal process is annealing and annealing will be described throughout the remainder of the Figures. The apparatus 200 comprises a continuous wave electromagnetic radiation source 202, a stage 216 configured to receive a semiconductor substrate 214 thereon, and optics 220 disposed between the continuous wave electromagnetic radiation source 202 and the stage 216.

In a preferred embodiment, the semiconductor substrate 214 is any substrate having high thermal conductivity, such as a single crystal silicon substrate, silicon on insulator (SOI), Silicon Germanium or alloys thereof, or the like. It should be appreciated that the semiconductor substrate 214 is not a glass or quartz substrate with a silicon layer thereon, as used for manufacturing thin film transistors (TFT). Thermal flux processing of semiconductor substrates is more difficult than that of TFTs, as semiconductor substrates have a much higher thermal conductivity than TFTs and the semiconductor substrate's applications require tighter control.

The continuous wave electromagnetic radiation source 202 is capable of emitting continuous waves or rays of electromagnetic radiation, such as light. By continuous wave it is meant that the radiation source is capable of emitting radiation continuously, i.e., not a burst, pulse, or flash of light. Unlike lasers used in laser annealing, the continuous wave electromagnetic radiation source 202 is capable of emitting radiation continuously.

Furthermore, as the continuous wave electromagnetic radiation needs to be adsorbed at or near the surface of the wafer, the continuous wave electromagnetic radiation preferably has a wavelength between 190 nm and 950 nm. More preferably, it has a wavelength of 808 nm.

In a preferred embodiment, the continuous wave electromagnetic radiation source 202 is capable of emitting radiation continuously for at least 15 seconds. Also, in a preferred embodiment, the continuous wave electromagnetic radiation source 202 comprises multiple laser diodes, each of which produces uniform and spatially coherent light at the same wavelength. In yet another preferred embodiment, the power of the laser diode/s is in the range of 0.5 kW to 50 kW, but preferably approximately 5 kW. Suitable laser diodes are made by Spectra-Physics of California, or by Cutting Edge Optronics, Inc. of St. Charles Mo. One such suitable laser diode is Spectra Physics' MONSOON® multi-bar module (MBM), which provides 40–480 watts of continuous wave power per laser diode.

The optics 220 preferably comprise one or more collimators 206 to collimate radiation 204 from the continuous wave electromagnetic radiation source 202 in a direction perpendicular to the upper surface 224 of the semiconductor substrate 214. This collimated radiation 208 is then focused by at least one lens 210 into a line of radiation 222 at an upper surface 224 of the semiconductor substrate 214.

Lens 210 is any suitable lens, or series of lenses, capable of focusing radiation into a line. In a preferred embodiment, lens 210 is a cylindrical lens. Alternatively, lens 210 may be one or more concave lenses, convex lenses, plane mirrors, concave mirrors, convex mirrors, refractive lenses, diffractive lenses, Fresnel lenses, gradient index lenses, or the like.

The stage 216 is any platform capable of securely holding the semiconductor substrate 214 during translation, as explained below. In a preferred embodiment, the stage 216 includes a means for grasping the substrate, such as a frictional, gravitational, mechanical, or electrical system. Examples of suitable means for grasping include, mechanical clamps, electrostatic or vacuum chucks, or the like.

The apparatus 200 also comprises a translation mechanism 218 configured to translate the stage 216 and the line of radiation 222 relative to one another. In one embodiment, the translation mechanism 218 is coupled to the stage 216 to move the stage 216 relative to the continuous wave electromagnetic radiation source 202 and/or the optics 220. In another embodiment, the translation mechanism 218 is coupled to the continuous wave electromagnetic radiation source 202 and/or the optics 220 to move the continuous wave electromagnetic radiation source 202 and/or the optics 220 relative to the stage 216. In yet another embodiment, the translation mechanism 218 moves both the electromagnetic radiation source 202 and/or the optics 220, and the stage 216. Any suitable translation mechanism may be used, such as a conveyor system, rack and pinion system, or the like.

The translation mechanism 218 is preferably coupled to a controller to control the scan speed at which the stage 216 and the line of radiation 222 move relative to one another. In addition, the translation of the stage 216 and the line of radiation 222 relative to one another is preferably along a path perpendicular to the line of radiation 222 and parallel to the upper surface 224 of the semiconductor substrate 214. In a preferred embodiment, the translation mechanism 218 moves at a constant speed. Preferably, this constant speed is approximately 2 cm/s for a 35 micron wide line. In another embodiment, the translation of the stage 216 and the line of radiation 222 relative to one another is not along a path perpendicular to the line of radiation 222.

FIG. 2B is a top view of the substrate and stage shown in FIG. 2A. In a preferred embodiment, the semiconductor substrate 214 is a circular wafer with a diameter of 200 or 300 mm, and a thickness of approximately 750 microns. Also, in a preferred embodiment, the line of radiation 222 has a length that extends at least across the entire diameter or width of the semiconductor substrate 214. The line of radiation 222 also preferably has a width 228 of between 3 and 500 microns. However, in a preferred embodiment, the line of radiation 222 has a width 228 of approximately 35 microns. The width is measured at half the maximum intensity of the radiation (otherwise knows as Full Width Half Max (FWHM)). In all embodiments, the length of the line is longer than its width. In a preferred embodiment, the line of radiation 222 linearly traverses the semiconductor substrate 214, such that it remains parallel to a fixed line or chord 252 at all times.

A preferred power density at the line of radiation is between 10 kW/cm$^2$ and 200 kW/cm$^2$ with a nominal range near 60 kW/cm$^2$. It is not readily achievable to radiate the entire surface of a substrate at these power densities, but it is possible to scan across the substrate a line of radiation that has this intensity. For example, an experiment using a 400 microns wide line of radiation with a peak power density of 70 kW/cm$^2$ scanned at 100 cm/s, heated the surface of a silicon substrate to approximately 1170° C. with ramp-up and ramp-down rates exceeding 4 million ° C./s.

Figure 3:
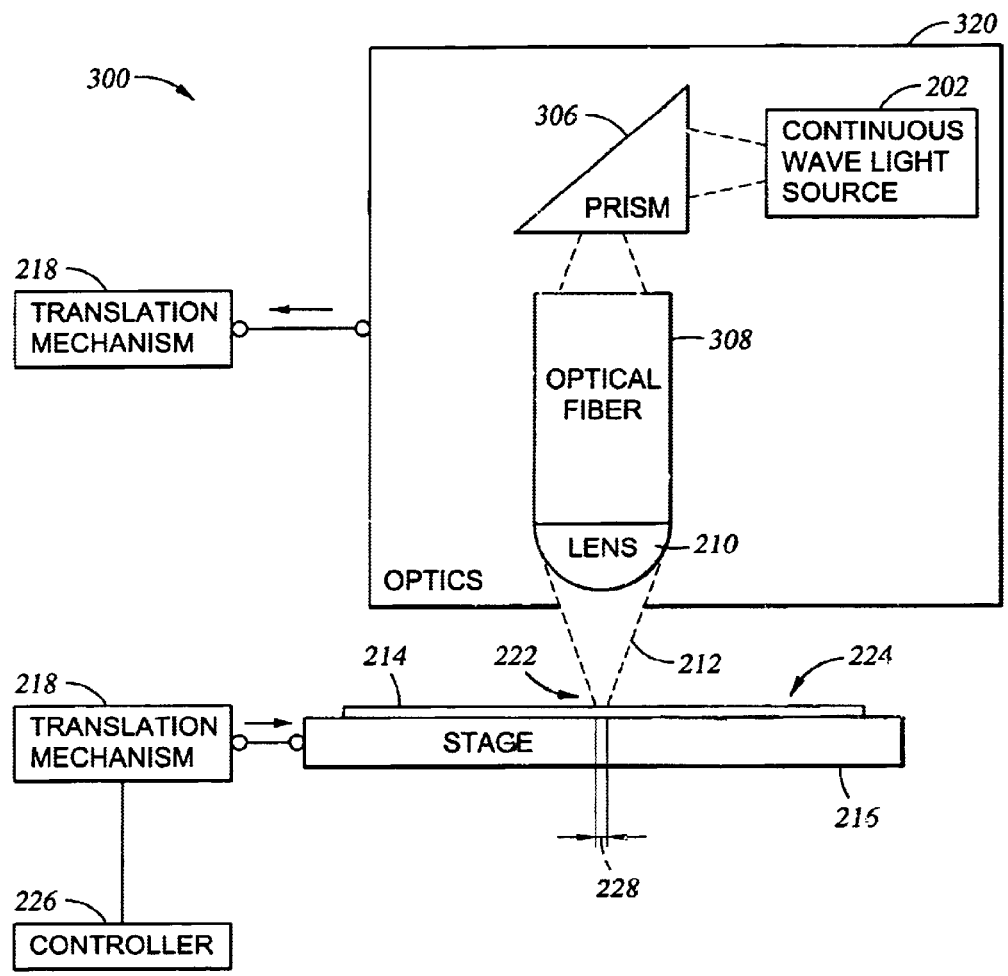
FIG. 3 is a side view of another apparatus for thermally processing a semiconductor substrate, according to another embodiment of the invention.

FIG. 3 is a side view of another apparatus 300 for thermally processing a semiconductor substrate, according to another embodiment of the invention. This embodiment merely shows another arrangement of optics 320. In this embodiment, the optics 320 comprise a lens 210 and one or more radiation guides, such as one or more optical fibers 308 and prism 306. Other radiation guides such as a waveguide, mirror, or diffuser may also be used.

Radiation from the continuous wave electromagnetic radiation source 202 is directed at the prism 306 which redirects the radiation towards one or more optical fibers 308. Radiation is transmitted through the optical fiber/s 308 towards the lens 210, where it is focused into a line of radiation 222.

It should be appreciated that many different combinations of the aforementioned optics 220 (FIG. 2A) or 320 may be used to transmit and focus the radiation from the continuous wave electromagnetic radiation source into a line of radiation. Also, a linear array of laser diodes could be used as the radiation source. Additionally, any suitable means for producing a uniform radiation distribution, such as a radiation diffuser, may be used.

Figure 4:
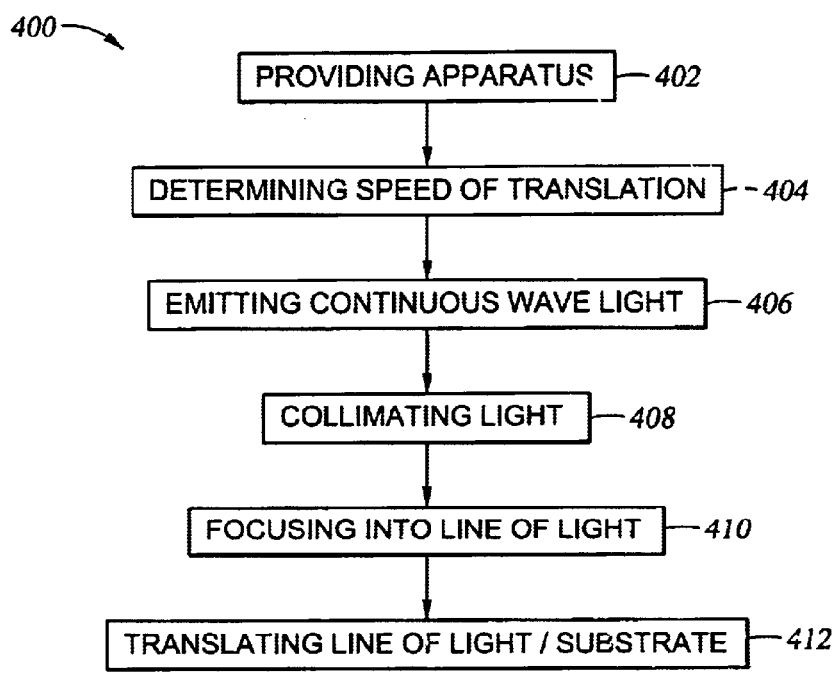
FIG. 4 is a flow chart of a method for thermally processing a semiconductor substrate.

FIG. 4 is a flow chart 400 of a method for thermally processing a semiconductor substrate 214 (FIG. 2A). An apparatus as described above in relation to FIGS. 2 and 3 is provided at step 402. The controller 226 (FIG. 2A) then determines, at step 404, the scan speed at which the line of radiation 222 (FIG. 2A) and the substrate will move relative to one another. This determination is based on the thermal recipe for processing the substrate; the substrate properties; the power of the continuous wave electromagnetic radiation source 202 (FIG. 2A); the width of the line of radiation; the power density at the line of radiation; etc.

The continuous wave electromagnetic radiation source 202 (FIG. 2A) emits a continuous wave of radiation 204 (FIG. 2A), at step 406. This radiation 204 is preferably collimated into a collimated beam of radiation 208 (FIG. 2A), at step 408. The collimated beam of radiation 208 (FIG. 2A) is focused into a line of radiation 222 (FIG. 2A), at step 410. In accordance with the predetermined scan speed, the stage 216 (FIG. 2A) and the line of radiation 222 (FIG. 2A) are translated, at step 412, relative to one another by the translation mechanism 218 (FIG. 2A). This translation is along a path perpendicular to the line of radiation 222 and parallel to the upper surface of the substrate, such that the line of radiation traverses the entire semiconductor substrate 214. In a preferred embodiment, the translation mechanism 218 scans the radiation source and optics over the upper surface of the substrate at approximately 2 cm/s.

Figure 5:
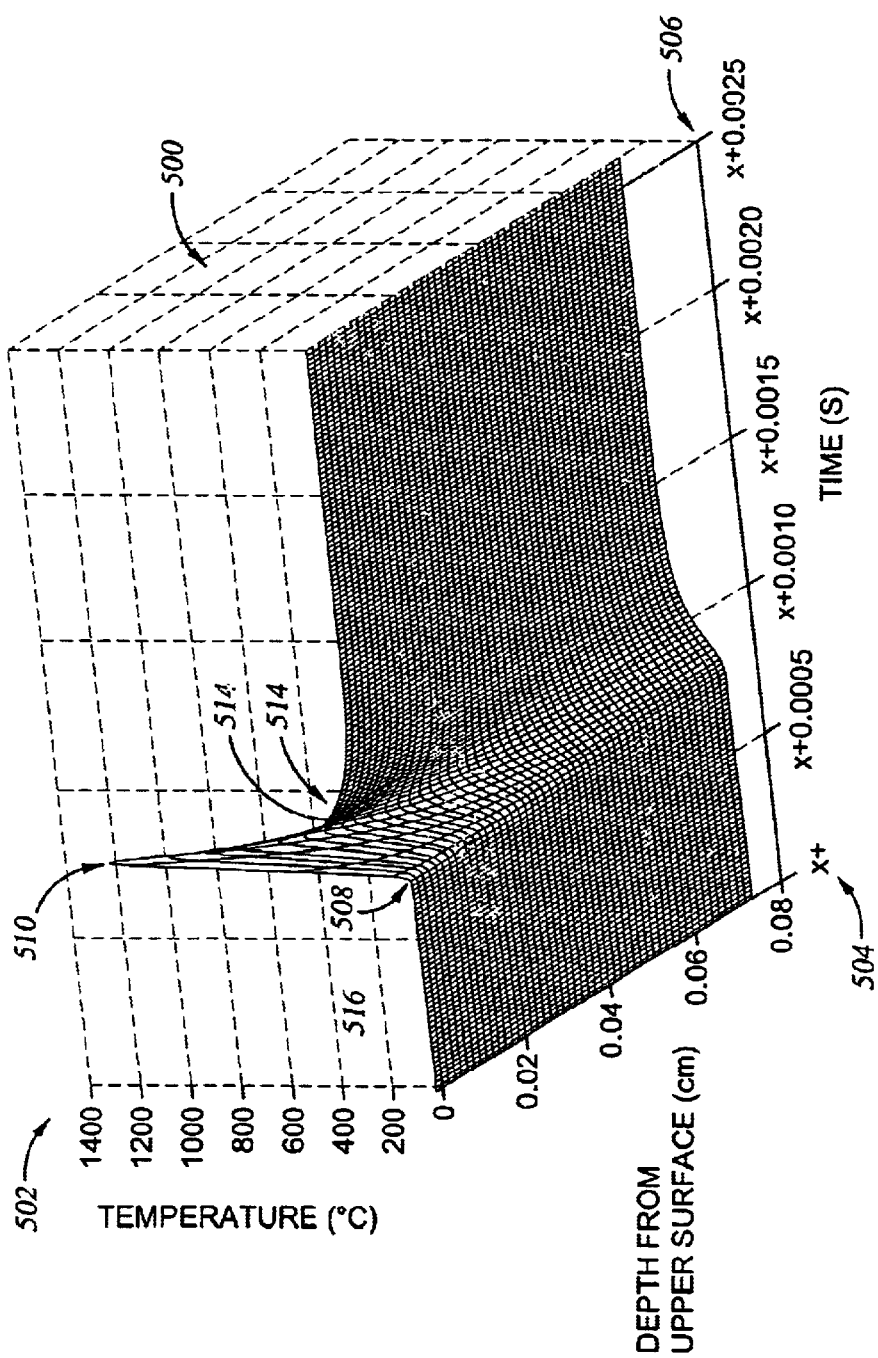
FIG. 5 is a graph of the temperature at a fixed point on and through the substrate during thermal processing, according to an embodiment of the invention.

FIG. 5 is a graph 500 of the temperature versus time and depth at a fixed point on and through the substrate during thermal processing performed according to the method described above in relation to FIG. 4. A temperature axis 502 indicates a temperature of between 0 and 1400° C. at the fixed point. Axis 504 indicates a depth from the upper surface 224 (FIG. 2B) into the semiconductor substrate 214 (FIG. 2B) at the fixed point. Axis 506 indicates the time in seconds at some point after the start of scanning. The fixed point is assumed to be located at 508.

As the line of radiation 222 (FIG. 2B) scans across the upper surface 224 (FIG. 2B) of the semiconductor substrate 214 (FIG. 2B) it subjects a line or chord on the substrate to the heat it generates. Before the line of radiation reaches the fixed point, the temperature at the fixed point, both at the upper surface and throughout a substrate cross-section at the fixed point, is ambient temperature, as indicated by reference numeral 516. As soon as the line of radiation reaches the fixed point at 508, the temperature at the upper surface ramps up to 1200° C. almost instantaneously, as shown by reference numeral 510. At the same time, the semiconductor substrate acts as a heat sink resulting in a dramatic drop-off in temperature away from the surface, as indicated by reference numeral 512. For example, as shown in FIG. 5, at 0.04 cm from the point on the the upper surface the temperature is approximately 200° C. Thus, the heating effect is generally localized to the upper surface only. This is extremely advantageous, as generally only the regions near the upper surface 224 (FIG. 2A) of the substrate require thermal processing.

As the line of radiation passes over and away from the fixed point, the temperature drops rapidly, as shown at reference numeral 514. Again this is because the semiconductor substrate acts as a heat sink diffusing the heat at the upper surface throughout the remainder of the cooler substrate. This is not possible with prior art thermal systems, such as RTP, that simultaneously heat the entire substrate, as the entire substrate is at an elevated temperature and, therefore, cannot easily dissipate the heat to a cooler region. In fact, no comparison can be made to RTP on the time scale shown in FIG. 5, as a superimposed RTP graph would yield an almost flat plane at 1100° C. extending for about one second. One second is nearly three orders of magnitude greater than the time period illustrated in FIG. 5.

This transfer of heat to the bulk of the substrate assists homogenous thermal exposure, as heat has enough time to diffuse from a locally strong absorbing device region to a lower absorbing device region. Also, pattern density effects are comparable to RTP. However, the time scale is short enough to limit the diffusion depth of the heat transfer to several microns, as opposed to the several hundred-micron thickness of a substrate, as is the case with RTP, thereby greatly reducing the total required power. The bulk of the substrate is not appreciably heated, thereby providing an ideal heat sink for the temperature ramp down.

One concern of prior art laser annealing systems, regards stress related defects caused by rapidly heating relatively small areas of a substrate. Therefore, experimentation was undertaken to test whether the thermal flux processing of the present invention causes any stress related defects in the substrate. Peak stress occurs near the max temperature gradient, not the max temperature. If a line of radiation is suitably narrow and the depth of heating suitably shallow, it is possible to displace the region of maximum thermal gradient from the region of highest temperature, thereby increasing the slip window and decreasing defects. During this experimentation, a sample was scanned at 20 cm/s under a 400 microns wide line of radiation with a peak power density of 60 kW/cm$^2$. The present invention was able to displace the peak thermal gradient from the peak temperature, thus enabling Ultra Shallow Junction (USJ) formation suitable for the 70 nm node with a 1 keV Boron implant without introducing any dislocations. Only the typical implant related defects were observed.

In another embodiment, the line of continuous wave electromagnetic radiation does not extend across the entire width of the semiconductor substrate. Rather, the line extends across the partial width of the semiconductor substrate. In this embodiment, the line of continuous wave electromagnetic radiation may make more than one scans across the substrate surface.

The foregoing descriptions of specific embodiments of the present invention are presented for purposes of illustration and description. They are not intended to be exhaustive or to limit the invention to the precise forms disclosed. Obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Furthermore, the order of steps in the method are not necessarily intended to occur in the sequence laid out. It is intended that the scope of the invention be defined by the following claims and their equivalents.

What is claimed is:

1. A thermal flux processing device, comprising:
   a continuous wave electromagnetic radiation source comprising multiple laser diodes and having a power between 0.5 kw and 50 kW;
   a stage configured to receive a substrate thereon;
   refractive optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate; and
   a translation mechanism configured to translate said stage and the line continuous wave electromagnetic radiation relative to one another.

2. The thermal flux processing device of claim 1, wherein said multiple laser diodes are implemented in a multi-bar module.

3. A thermal flux processing device, comprising:
   a continuous wave electromagnetic radiation source having a power between 0.5kW and 50kW, wherein said continuous wave electromagnetic radiation source has a power of approximately 5kW;
   a stage configured to receive a substrate thereon;
   optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate; and
   a translation mechanism configured to translate said stage and the line of continuous wave electromagnetic radiation relative to one another.

4. A thermal flux processing device comprising:
   a continuous wave electromagnetic radiation source comprising a plurality of laser diodes;
   a stage configured to receive a substrate thereon;
   refractive optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate, wherein the line of radiation has a power density of between 10 kW/cm$^2$ and 200kW/cm$^2$; and
   a translation mechanism configured to translate said stage and the line of continuous wave electromagnetic radiation relative to one another.

5. The thermal flux processing device of claim 4, wherein said line of continous wave electromagentic radiation extends entirely across the width of the substrate.

6. The thermal flux processing device of claim 4, wherein said continuous wave electromagnetic radiation has a wavelength between 190nm and 950nm.

7. The thermal flux processing device of claim 4, wherein said plurality of laser diodes are implemented in a multi-bar module.

8. The thermal flux processing device of claim 4, wherein the line of radiation has a power density of approximately 60 kW/cm$^2$.

9. The thermal flux processing device of claim 4, wherein said stage includes a means for securely grasping said substrate.

10. The thermal flux processing device of claim 4, wherein said optics comprise at least one collimator and at least one lens configured to focus the continuous wave electromagnetic radiation from said continuous wave electromagnetic radiation source into said line of continuous wave electromagnetic radiation at the upper surface of the substrate.

11. The thermal flux processing device of claim 4, wherein said optics comprise at least one cylindrical lens configured to focus the continuous wave electromagnetic radiation from said continuous wave electromagnetic radiation source into said line of continuous wave electromagnetic radiation at the upper surface of the substrate.

12. The thermal flux processing device of claim 4, wherein said substrate is a thin film transistor panel.

13. The thermal flux processing device of claim 4, further comprising a controller to control the speed of said translation mechanism.

14. The thermal flux processing device of claim 4, wherein said translation mechanism moves said stage and the line of continuous wave electromagnetic radiation relative to one another at constant speed.

15. The thermal flux processing device of claim 4, wherein said translation mechanism is coupled to said stage.

16. The thermal flux processing device of claim 4, wherein said translation mechanism is coupled to said optics.

17. The thermal flux processing device of claim 16, wherein said translation mechanism is additionally coupled to said continuous wave electromagnetic radiation source.

18. The thermal flux processing device of claim 4, wherein said translation mechanism moves said stage and the line of continuous wave electromagnetic radiation relative to one another in direction substantially perpendicular to said line of radiation.

19. The thermal flux processing device of claim 4, wherein said substrate is a semiconductor substrate.

20. The thermal flux processing device of claim 4, wherein said substrate is a single crystal silicon substrate.

21. The thermal flux processing device of claim 4, wherein said continuous electromagnetic radiation source is capable of causing said line of radiation to have said power density in said line.

22. A thermal flux processing device comprising:
a continuous wave electromagnetic radiation source;
a stage configured to receive a substrate thereon;
optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, wherein a length of the line of continuous wave electromagnetic radiation extends at least partially across the substrate, wherein the line of radiation has a width of approximately 35 microns.

23. A thermal flux processing device, comprising:
a continuous wave electromagnetic radiation source;
a stage configured to receive a substrate thereon;
optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate; and
a translation mechanism configured to translate said stage and the line of continuous wave electromagnetic radiation relative to one another;
wherein said device has a temperature ramp-up rate of larger than $1 \times 10^6$ °C/s.

24. A thermal flux processing device comprising:
a continuous wave electromagnetic radiation source;
a stage configured to receive a substrate thereon;
optics disposed between said continuous wave electromagnetic radiation source and said stage, where said optics are configured to focus continuous wave electromagnetic radiation from said continuous wave electromagnetic radiation source into a line continuous wave electromagnetic radiation on an upper surface of the substrate, wherein a length of the line of continuous wave electromagnetic radiation extends at least partially across the substrate; and
a translation mechanism configured to translate said stage and the line of continuous wave electromagnetic radiation relative to one another; wherein said device has a temperature ramp-down rate of larger than $1 \times 10^6$ °C/s.

25. A thermal flux processing device comprising:
a continuous wave electromagnetic radiation source;
a stage configured to receive a substrate thereon;
refractive lens optics disposed between said continuous wave electromagnetic radiation source and said stage, where said optics are configured to focus continuous wave electromagnetic radiation from said continuous wave electromagnetic radiation source into a line of continuous wavelength electromagnetic radiation on an upper surface of the substrate, where at length of the line of continuous wave electromagnetic radiation extends at leas partially across the substrate, wherein the line of radiation has a width of approximately 3 to approximately 35 microns wide.

26. The thermal flux processing device of claim 25, wherein said radiation source comprises plural laser diodes.

27. A method for thermally processing a semiconductor substrate, comprising:
focusing continuous wave electromagnetic radiation into a line of radiation extending at least partially across an upper surface of the substrate and having a power density on said upper surface of at least 10 kW/cm$^2$; and
translating said line of radiation relative to said surface.

28. The method of claim 27, comprising, prior to said focusing, determining said predetermined speed based on factors selected from a group consisting of:
a thermal recipe for processing said substrate, properties of said substrate, a power of said continuous wave electromagnetic radiation, a width of said line of radiation, a power density at said line of radiation, and any combination of the aforementioned.

29. The method of claim 27, wherein said substrate is a semiconductor substrate.

30. The method of claim 27, comprising, prior to said focusing, emitting said continuous wave electromagnetic radiation, where said continuous wave electromagnetic radiation is uniform and coherent radiation having a single wavelength.

31. The method of claim 27, comprising, prior to said focusing emitting said continuous wave electromagnetic radiation, where said continuous wave electromagnetic radiation is not pulsed or flashed.

32. The method of claim 27, comprising, prior to said focusing, collimating said continuous wave electromagnetic radiation.

33. The method of claim 27, wherein said substrate is a thin film transistor panel.

34. The thermal flux processing device of claim 27, wherein said lasers are diode lasers.

35. The thermal flux processing device of claim 34, wherein said diode lasers are implemented in a multi-bar module.

36. A thermal flux processing device comprising:
a continuous wave electromagnetic radiation source, wherein said continuous wave electromagetic radiation has a wavelength of 808 nm;
a stage configured to receive a substrate thereon;
optics disposed between said continuous wave electromagnetic radiation source and said stage, where said optics are configured to focus continuous wave electromagnetic radiation from said continuous wave electromagnetic radiation source into a line of continuous wave electromagnetic radiation on an upper surface of the substrate, where a length of the line of continuous wave electromagnetic radiation extends at least partially across the substrate, wherein the line of radiation has a power density of between 10 kW/cm$^2$ and 200 kW/cm$^2$ ; and
a translation mechanism configured to translate said stage and the line of continuous wave electromagnetic radiation relative to one another.

37. The thermal flux processing device of claim 36, wherein said radiation source comprises plural laser diodes emitting at 808 nm.

38. A method for thermally processing a substrate, comprising:
focusing continuous wave electromagetic radiation into a line of radiation extending at least partially across an upper surface of the substrate and having a power density on said upper surface of at least 10 kW/cm$^2$ ;
prior to said focusing, emitting and continuous wave electromagnetic radiation from one or more laser diodes; and
translating said line of radiation relative to said surface.

39. The thermal flux processing device of claim 38, wherein said one or more laser diodes comprise a plurality of laser diodes.

40. A method for thermally processing a substrate, comprising:
focusing continuous wave electromagnetic radiation into a line of radiation extending at least partially across an upper surface of the substrate, wherein said line of radiation is approximately 35 microns wide; and,
translating said line of radiation relat to said surfae at a constant predetermined speed, such that every point of said substrate has a substantially homogenous thermal exposure.

41. A thermal flux processing device, comprising:
a continuous wave electromagnetic radiation source;
a stage configured to receive a substrate thereon;
optics disposed between said continous wave electromagnetic radiation source and said stage including at least one radiation guide for guiding continuous wave electromagnetic radiation from said continuous wave electromagnetic radiation source, wherein said optics includes at least one lens comprising a diffractive lens disposed between said radiation guide and said stage to focus said continous wave electromagnetic radiation into a line of continuous wave electromagnetic radiation on an upper surface of the substrate, wherein at length of the line of continuous wave electromagentic radiation extends at least partially across the substrate; and
a translation mechanism configured to translate said stage and the line of continuous wave electromagnetic radiation relative to one another.

42. The device of claim 41, wherein said at least one radiation guide includes at least one waveguide.

43. The device of claim 42, wherein said at least oe waveguid comprises at least one optical fiber.

* * * * *